(12) United States Patent
Wu et al.

(10) Patent No.: US 11,587,893 B2
(45) Date of Patent: Feb. 21, 2023

(54) DISTRIBUTION LAYER STRUCTURE AND MANUFACTURING METHOD THEREOF, AND BOND PAD STRUCTURE

(71) Applicant: Changxin Memory Technologies, Inc., Anhui (CN)

(72) Inventors: Ping-Heng Wu, Hefei (CN); Chieh-Ting Hsu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 166 days.

(21) Appl. No.: 17/109,783

(22) Filed: Dec. 2, 2020

(65) Prior Publication Data

US 2021/0091019 A1    Mar. 25, 2021

Related U.S. Application Data (63) Continuation of application No. PCT/CN2019/119760, filed on Nov. 20, 2019.

(30) Foreign Application Priority Data

Nov. 21, 2018 (CN) .......................... 201811391850.3
Nov. 21, 2018 (CN) .......................... 201821922748.7

(51) Int. Cl.
   *H01L 23/00* (2006.01)
(52) U.S. Cl.
   CPC .............. *H01L 24/02* (2013.01); *H01L 24/05* (2013.01); *H01L 2224/0235* (2013.01);
   (Continued)
(58) Field of Classification Search
   CPC ................................ H01L 24/02; H01L 24/05
   See application file for complete search history.

(56) References Cited

U.S. PATENT DOCUMENTS 5,008,734 A * 4/1991 Dutta ................ H01L 23/49537
                                                                257/E23.185
6,100,589 A    8/2000 Tanaka
(Continued)

FOREIGN PATENT DOCUMENTS

CN          1612333 A     5/2005
CN        104350586 A     2/2015
(Continued)

OTHER PUBLICATIONS

PCT International Search Report and the Written Opinion dated Feb. 28, 2020, issued in related International Application No. PCT/CN2019/119760 (8 pages).

*Primary Examiner* — Nathan W Ha
(74) *Attorney, Agent, or Firm* — Sheppard Mullin Richter & Hampton LLP (57) ABSTRACT

A distribution layer structure and a manufacturing method thereof, and a bond pad structure are provided. The distribution layer structure includes a dielectric layer and a wire layer embedded in the dielectric layer. The wire layer includes a frame and a connection line, the frame has at least two openings and is divided into a plurality of segments by the at least two openings. The connection line is located in the frame and has a plurality of connecting ends connected to the frame. The connection line divides an interior of the frame into a plurality of areas, with each segment connected to one of the connecting ends, and each area connected to one of the openings. This structure provides improved binding force between the wire layer and the dielectric layer without increasing a resistance of a wire connecting with a top bond pad.

19 Claims, 9 Drawing Sheets

(52) U.S. Cl.
 CPC ............... *H01L 2224/0239* (2013.01); *H01L 2224/02311* (2013.01); *H01L 2224/04042* (2013.01); *H01L 2224/05024* (2013.01); *H01L 2924/01013* (2013.01); *H01L 2924/01029* (2013.01); *H01L 2924/01074* (2013.01); *H01L 2924/35121* (2013.01)

(56) References Cited

U.S. PATENT DOCUMENTS

| | | |
|---|---|---|
| 7,148,574 B2 | 12/2006 | Lee et al. |
| 7,233,075 B2 | 6/2007 | Hung et al. |
| 7,800,227 B2 | 9/2010 | Kamiyama et al. |
| 9,754,861 B2 | 9/2017 | Wong |
| 10,497,662 B2 | 12/2019 | Risaki et al. |
| 10,566,268 B1 * | 2/2020 | Hall ................. H01L 23/49558 |
| 2012/0025394 A1 | 2/2012 | Hirano et al. |
| 2013/0154902 A1 * | 6/2013 | Liu ................. H01Q 15/0026 343/909 |
| 2015/0206835 A1 * | 7/2015 | Lamorey ........... H01L 21/76883 257/773 |
| 2016/0064184 A1 * | 3/2016 | Brown ................ H01J 49/02 250/307 |
| 2016/0358870 A1 * | 12/2016 | Kuan ............... H01L 21/76877 |
| 2019/0189568 A1 * | 6/2019 | Shen ................... H01L 24/13 |
| 2019/0267690 A1 * | 8/2019 | Vaughn ................ H01P 1/182 |
| 2020/0285366 A1 * | 9/2020 | Agari .................. G06F 3/0448 |

FOREIGN PATENT DOCUMENTS

| | | |
|---|---|---|
| CN | 105514078 A | 4/2016 |
| CN | 209119084 U | 7/2019 |
| JP | 2011-009515 A | 1/2011 |

\* cited by examiner

DISTRIBUTION LAYER STRUCTURE AND MANUFACTURING METHOD THEREOF, AND BOND PAD STRUCTURE

CROSS-REFERENCE TO RELATED APPLICATIONS

This application is a continuation application of International Patent Application No. PCT/CN2019/119760, filed on Nov. 20, 2019, which is based on and claims priority of the Chinese Patent Application Nos. 201811391850.3 and 201821922748.7, both of which were filed on Nov. 21, 2018 and entitled "DISTRIBUTION LAYER STRUCTURE AND MANUFACTURING METHOD THEREOF, AND BOND PAD STRUCTURE." The above-referenced applications are incorporated herein by reference in their entirety.

TECHNICAL FIELD

The present invention relates generally to the technical field of semiconductor technologies and more specifically, but not by way of limitation, to a distribution layer structure and a manufacturing method thereof, and a bond pad structure.

BACKGROUND

In the field of semiconductor manufacturing, a bond pad is used to connect a semiconductor pin to a packaging pin of a device, and needs to have good conductivity and mechanical strength.

A bond pad structure generally includes a distribution layer, which is configured to arrange an input/output port of the bond pad to improve the performance and reliability of a packaged integrated circuit (IC). Conventional distribution layers have poor structural and mechanical strength. As a result, in wire bonding of packaging, the bond pad may be entirely or partially peeled off along with a dielectric layer in the distribution layer, resulting in damages to the bond pad structure.

It is to be noted that the information disclosed in the above background is merely for facilitating the understanding on the background of the present invention and thus may include information that does not constitute the prior art known to a person of ordinary skill in the art.

SUMMARY

In view of the limitations of existing technologies described above, the present invention provides a distribution layer structure, a manufacturing method thereof, and a bond pad structure, which improve the mechanical strength of a distribution layer structure without increasing a resistance.

One aspect of the present invention is directed to a distribution layer structure. The structure may include a dielectric and a wire layer embedded in the dielectric. The wire layer may include a frame and a connection line. The frame may have at least two openings and may be divided into a plurality of segments by the at least two openings. The connection line may be located inside the frame and may connected to each segment. The connection line may divide an interior of the frame into a plurality of areas, and each area may be connected to one of the openings.

In some embodiments of the present invention, the connection line may include a plurality of wires each having a straight shape. The plurality of wires may be contacted or crossed with each other.

In some embodiments of the present invention, the plurality of wires may be disposed symmetrically or asymmetrically.

In some embodiments of the present invention, the number of the plurality of wires may be 2 to 3.

In some embodiments of the present invention, the openings may be distributed on the frame symmetrically or asymmetrically.

In some embodiments of the present invention, the number of the openings may be 2 to 4.

In some embodiments of the present invention, the frame may have a rectangular shape and may have four openings. The connection line may include two wires. The four openings may be respectively located at four corners of the frame, the two wires may be crossed over each other perpendicularly, and each of the two wires may have two ends respectively connected to midpoints of sides of the frame.

In some embodiments of the present invention, the frame may have a rectangular shape and may have four openings. The connection line may include two wires. The four openings may be respectively located at centers of four sides of the frame, the two wires may be crossed over each other, and each of the two wires may have two ends respectively connected to opposite corners of the frame.

In some embodiments of the present invention, the frame may have a rectangular shape and may have four openings. The connection line may include three wires. The four openings may be respectively located at centers of four sides of the frame. Two wires of the three wires may each be connected to segments corresponding to two sides of the frame on a same side, and a third wire of the three wire may be connected to midpoints of the two wires.

In some embodiments of the present invention, the wire layer may be located on one side of a bond pad metal layer. The structure may further include a through via embedded in the dielectric layer and electrically connected to the wire layer, and configured to connect the wire layer and the bond pad metal layer.

In some embodiments of the present invention, the structure may further include a plurality of conductive layers, located on a side of the wire layer facing away from the bond pad metal layer. The plurality of conductive layers may be electrically connected with each other, and electrically connected to the wire layer.

In some embodiments of the present invention, the wire layer may be made of one or more of copper, aluminum and tungsten.

Another aspect of the present invention is directed to a manufacturing method of a distribution layer structure. The method may include forming a first dielectric layer, and forming a wire layer in the first dielectric layer. The wire layer may include a frame and a connection line, the frame may have at least two openings, the connection line may be located inside the frame and may connected to the frame. The connection line may divide an interior of the frame into a plurality of areas, with each area connected to one of the openings.

In some embodiments of the present invention, the method may further include: forming a second dielectric layer covering the first dielectric layer on the first dielectric layer; and forming a through via electrically connected to the wire layer in the second dielectric layer.

In some embodiments of the present invention, forming a through via electrically connected to the wire layer in the second dielectric layer may include: depositing a photoresist on the second dielectric layer; exposing the photoresist;

developing, etching and stripping the second dielectric layer to form a through hole; and depositing a conductive material in the through hole to form the through via.

In some embodiments of the present invention, forming a wire layer in the first dielectric layer may include: depositing a photoresist on the first dielectric layer; exposing the photoresist; developing, etching and stripping the first dielectric layer to form a groove; and depositing a conductive material in the groove to form the wire layer.

Another aspect of the present invention is directed to a bond pad structure. The bond pad structure may include a distribution layer structure and a bond pad metal layer disposed on the distribution layer structure and electrically connected to the distribution layer structure.

The distribution layer structure may include a dielectric layer and a wire layer embedded in the dielectric layer. The wire layer may include a frame and a connection line. The frame may have at least two openings and may be divided into a plurality of segments by the at least two openings. The connection line may be located inside the frame and may connected to each segment. The connection line may divide an interior of the frame into a plurality of areas, and each area may be connected to one of the openings.

In some embodiments of the present invention, the wire layer may be electrically connected to the bond pad metal layer via a through via.

In some embodiments of the present invention, the bond pad structure may further include: a protective layer covering the bond pad metal layer and having an opening to exposing the bond pad metal layer.

According to the present invention, a wire layer in a distribution layer structure may have an exterior frame and interior a connection line. The exterior frame may have at least two openings and each area in the frame may be connected to one of the openings, so that each segment of the frame is connected to connecting ends of one of the connection line. Compared with existing technologies, the wire layer and the dielectric layer in the present invention are each an integral structure. This structure provides improved binding force between an interior of the wire layer and the dielectric layer. Moreover, since the wire layer is not obstructed, a resistance of a wire connected with a top bond pad is not increased. Additionally, since the dielectric layer as a whole is not cut off by the wire layer, the mechanical strength of a dielectric structure may be ensured. When an upward tensile force is applied in a manufacture process to pull a bond wire in wire bonding of packaging, the distribution layer structure can provide more reliable resistance force to protect the bond pad.

It is to be understood that both the foregoing general description and the following detailed description are exemplary and explanatory only and are not necessarily restrictive to the present invention.

BRIEF DESCRIPTION OF THE DRAWINGS

The accompanying drawings, which are incorporated in and constitute a part of the specification, illustrate embodiments of the present invention and together with the specification, serve to explain the principles of the present invention. Apparently, the accompanying drawings in the following description are only some embodiments of the present invention, and a person of ordinary skill in the art can derive other drawings from the accompanying drawings without creative efforts.

In the drawings: 1: dielectric layer; 2: wire layer; 3: through via; 4: distribution layer structure; 5: bond pad metal layer; 6: photoresist; 7: protective layer; 11: first dielectric layer; 12: second dielectric layer; 21: frame; 22: connection line; and 23: opening.

In FIGS. 1, 3, 4, 5, 11, 12, 13, 14, 15, and 16, the drawing on the top is a top view drawing, and drawing on the bottom is a sectional view along line A-A in the corresponding top view drawing.

DETAIL DESCRIPTION OF THE EMBODIMENTS

Exemplary embodiments will be described more completely with reference to the accompanying drawings. However, the exemplary embodiments can be implemented in various forms, and should not be understood as being limited to the embodiments described herein. Instead, these embodiments are provided to make the present invention thorough and complete, and convey the concepts of the exemplary embodiments to the person skilled in the art fully. Identical numerals in the drawings represent an identical or similar structure and thus the detailed descriptions thereof are omitted.

Figure 1:
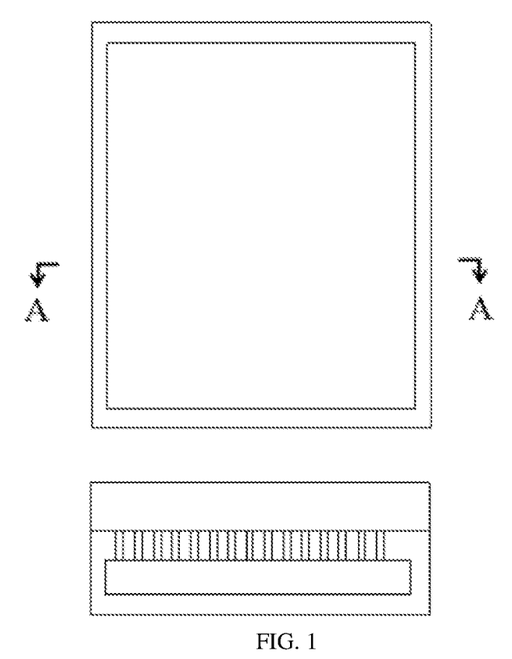
FIG. 1 is a schematic diagram of a bulk type wire layer in a conventional distribution layer.
Figure 2:
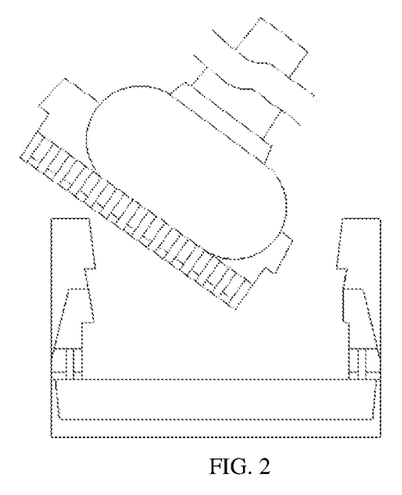
FIG. 2 is a schematic diagram of a damage of a conventional distribution layer structure.

In the related art, a conductive material in a distribution layer structure may be designed as a bulk type metal (as shown in FIG. 1). Due to poor binding force between the bulk type metal and a dielectric layer, a bond pad may easily be entirely or partially peeled off along with the dielectric layer when a bond wire is pulled in wire bonding of packaging, causing damages to a bond pad structure, as shown in FIG. 2.

Figure 3:
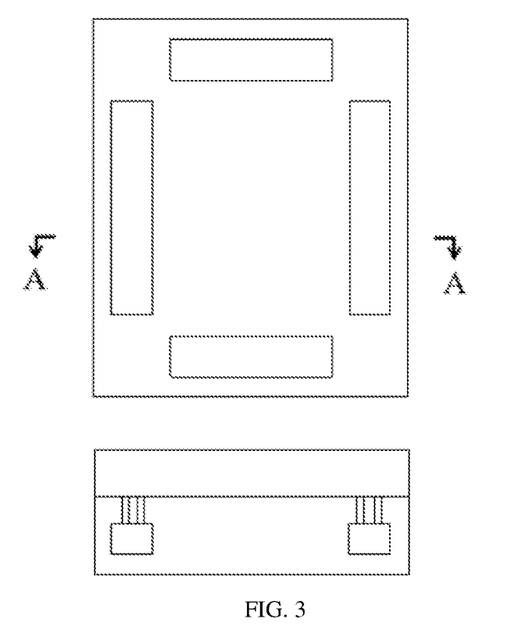
FIG. 3 is a schematic diagram of a bar type wire layer in a conventional distribution layer.
Figure 4:
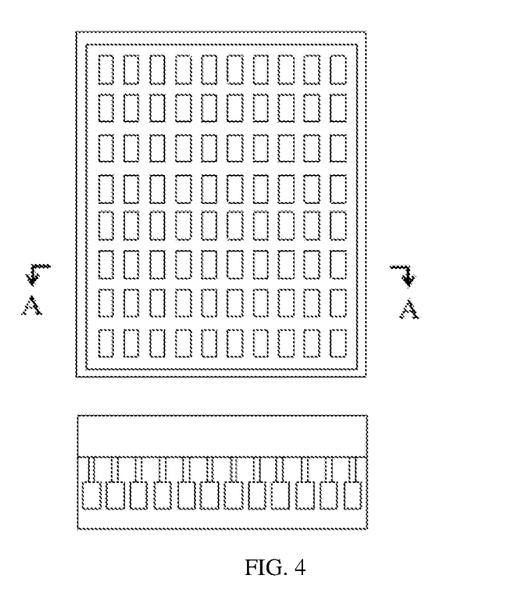
FIG. 4 is a schematic diagram of a mash type wire layer in a conventional distribution layer.

Conventionally, the common practice in the industry is to design the conductive material in the distribution layer structure as a bar type (as shown in FIG. 3) to reduce a contact area with the dielectric layer. However, cutting off a line, which is required in the bar type design, may increase the resistance of the line. Another method is to design the conductive material in the distribution layer structure as a mash type (as shown in FIG. 4). Although a mash type conductive material can keep the line connected, the mashed dielectric layer has poor binding force and mechanical strength.

The present invention first provides a distribution layer structure, which may be configured to arrange input and output ports of a bond pad to improve the performance and reliability of a packaged IC.

Figure 5:
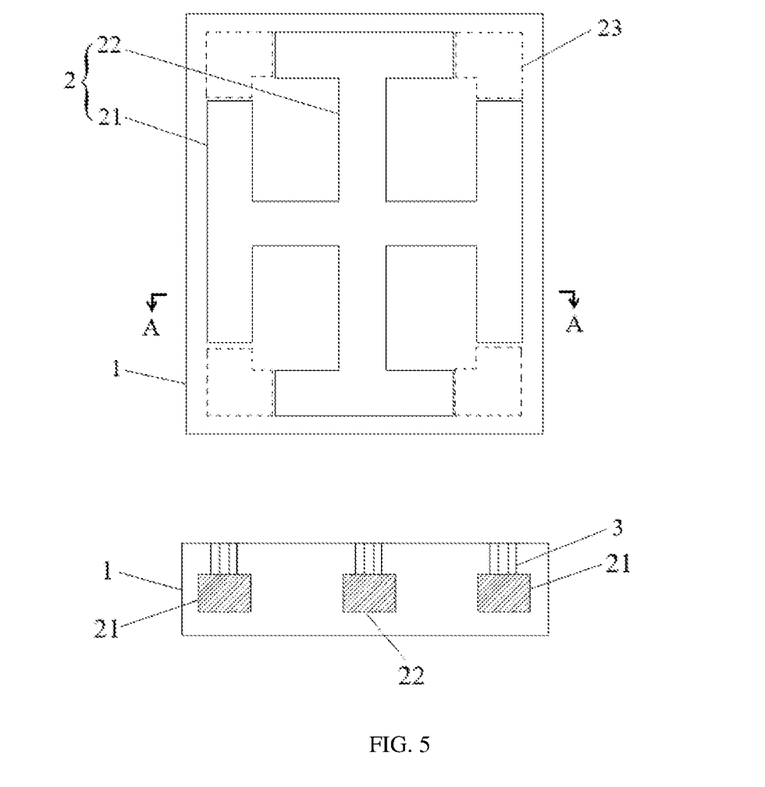
FIG. 5 is a schematic diagram of a wire layer in a distribution layer structure of the present invention.

As shown in FIG. 5, the distribution layer structure of the present invention may include a dielectric layer 1 and a wire layer 2 embedded in the dielectric layer 1. The wire layer 2 may include a frame 21 and a connection line 22. The frame 21 may have at least two openings 23, and may be divided into a plurality of segments by the at least two openings 23. The connection line 22 may be located in the frame 21 and may have a plurality of connecting ends connected to the frame 21. The connection line 22 may divide an interior of the frame 21 into a plurality of areas, each segment may be connected to one of the connecting ends of the connection line 22, and each area may be connected to one of the openings 23.

In this distribution layer structure, a frame is designed to have an open structure, and each area in the frame may be connected with one of the openings. Thus, the dielectric material inside and outside the frame is still of an integral structure. Each segment of the frame 21 may be connected to one of the connecting ends of the connection line 22, so the wire layer 2 is ensured to be of an integral connecting structure. This structure possesses the advantages of existing bar type and mash type structures. Compared to the bar type structure, this structure has improved binding force between the wire layer 2 and the dielectric layer 1, and since the wire layer 2 is not obstructed, the resistance of a wire connected with a top bond pad is not increased. Additionally, the dielectric layer 1 as a whole is not cut off by the wire layer 2, the dielectric layer 1 has enhanced mechanical strength compared with the mash type structure. When an upward tensile force is applied in a manufacture process of pulling a bond wire in wire bonding of packaging, the distribution layer structure can provide more reliable resistance to protect the bond pad.

Next, the distribution layer structure of the present invention will be described in detail using an example in which the distribution layer structure has a rectangular shape.

The dielectric layer in the distribution layer structure may serve as an insulator, and may be made of an inorganic dielectric material or an organic dielectric material. The material and size of the dielectric layer may be selected according to actual requirements. In the above embodiment, the dielectric material may be one of silicon oxide, silicon nitride, silicon oxynitride or a mixture thereof. The wire layer in the distribution layer structure may be a layer made of a conductive material, and may serve as a conductor. The wire layer may be made of one of metallic materials such as copper, aluminum and tungsten, and may also be made of a combination thereof. The shape of the distribution layer structure may be determined according to the shape of the bond pad, and may include, but not be limited to, a circular shape, a square shape, an octagonal shape, which will not be exhaustively listed herein.

The shape of the frame 21 of the wire layer may include, but not be limited to, a circular shape, a rectangular shape and other polygonal shapes according to actual needs. The openings 23 on the frame may divide the frame into a plurality of independent segments. The openings 23 may be rectangular openings, trapezoidal openings, or parallelogram openings, and this invention is not limited in this regard. Each of the openings 23 may be at any position of the frame 21. For example, an opening may be located in a center of a line of the frame 21 or an intersection point of two lines of the frame 21. The size and dimension of the frame 21 may be set as required, and this invention is not limited in this regard. The frame 21 may have at least two openings 23. If only one opening is provided, an enclosed area will always be separated out of the frame when a connection line is provided, and the integrity of the dielectric layer and the mechanical strength of the distribution layer structure may be adversely affected. The openings 23 may be distributed on the frame 21 symmetrically or asymmetrically.

In some embodiments, the number of openings may be 2 to 4.

Figure 6:
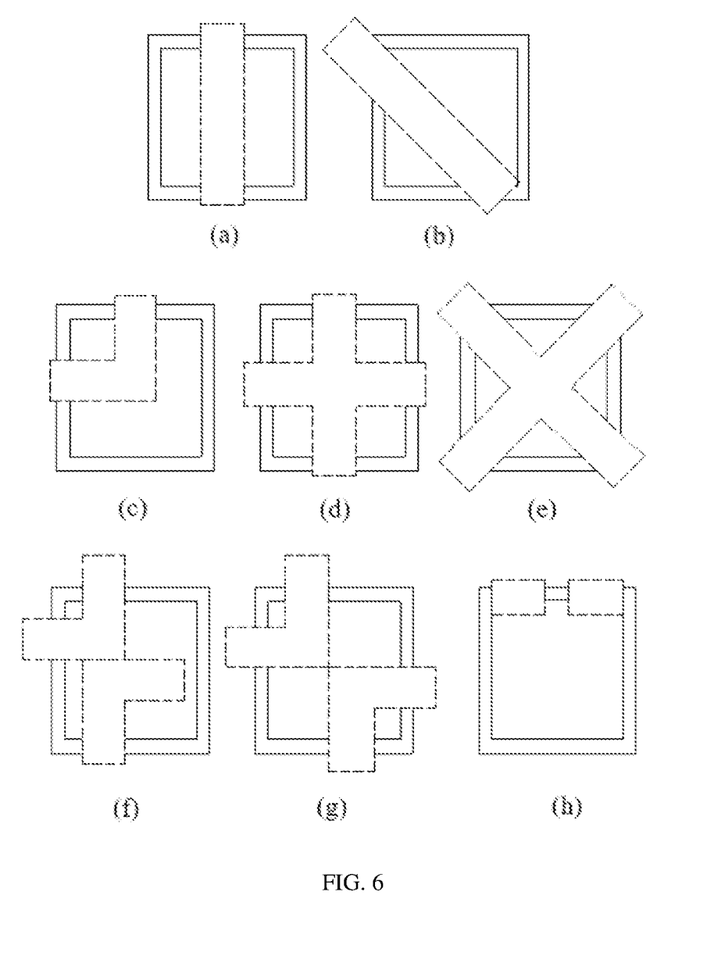
FIG. 6 is a schematic diagram of a frame in a wire layer of the present invention.

In one example, as shown in FIG. 6(a), the frame 21 may have a rectangular shape, and may have two openings respectively located at centers of two opposite sides of the rectangular frame 21. The two openings may also be located at two opposite corners of the rectangular frame 21 (as shown in FIG. 6(b)), or at centers of two adjacent sides of the rectangular frame 21 (as shown in FIG. 6(c)), or at two points of a same side of the rectangular frame 21 (as shown in FIG. 6(h)). In some embodiments, the frame 21 may have three openings. The three openings may be located at central or noncentral positions of three sides of the frame 21, as shown in FIG. 6(f). In some embodiments, the frame 21 may have four openings. The four openings may be respectively located at centers of four sides of the rectangular frame 21 (as shown in FIG. 6(d)), or at noncentral points of four sides of the rectangular frame 21 (as shown in FIG. 6(g)), or at four corners of the rectangular frame 21 (as shown in FIG. 6(e)).

The connection line 22 may include one wire or a plurality of wires. Each wire may be a straight line, a curve line or a fold line. If the connection line 22 only include one wire, the connection line may only have two connecting ends. If the connection line 22 include a plurality of wires, the connection line 22 may have a plurality of connecting ends corresponding to the plurality of wires. The plurality of wires may be disposed symmetrically or asymmetrically. Additionally, the connection line 22 may be a combination of a wire and other solid conductors. For example, a solid circular conductor may be provided at a center of the frame, and a plurality of wires may be provided on the periphery of and connected to the circular conductor. Specific implementations of the connection line will not be exhaustively listed herein. The dimension of the connection line in the present invention may be set as required, and this invention is not specifically limited in this regard. Regardless the number of wires included in the connection line, the connection line as a whole is a connected entity, not a combination of mutually disconnected lines.

In some embodiments of the present invention, the connection line may include a plurality of straight wires, which may be contacted or crossed over each other. Compared to other shapes, straight wires may provide a lower resistance, and a larger area of dielectric layer 1 may be retained, so that the interlayer binding force and mechanical strength may be improved.

Figure 7:
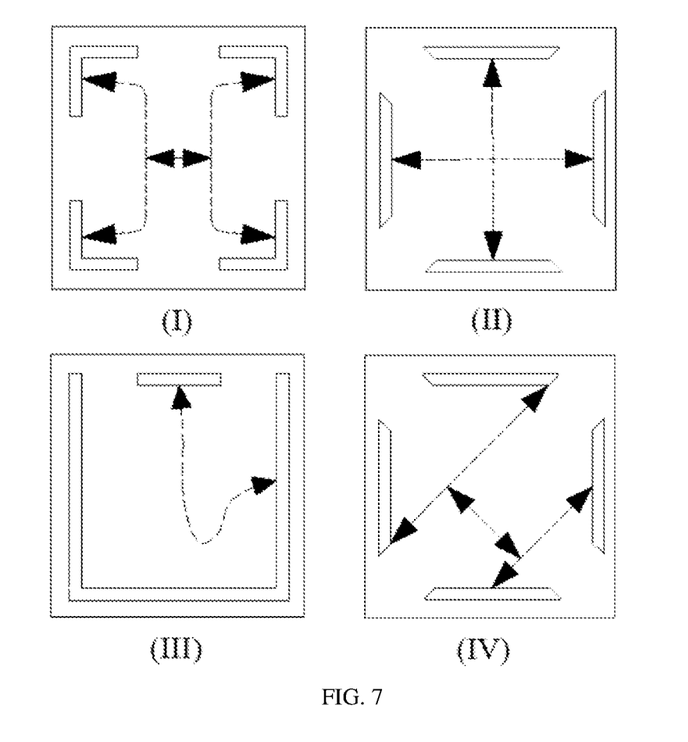
FIG. 7 is a schematic diagram of a connection line in a wire layer of the present invention.

In some embodiments of the present invention, the number of wires may be 1 to 3. As shown in FIG. 7, the connection line 22 may include one, two or three straight wires crossed over or contacted to each other. For example, as shown in FIG. 7(I), the frame 21 may have openings at centers of four sides respectively, and may be divided into four segments by the openings. The connection line 22 may include three wires. Two of the three wires may be fold lines disposed symmetrically and are respectively connected to two segments of the frame. A third wire may be a straight line to connect the two fold lines to establish the connection. Alternatively, as shown in FIG. 7(II), the frame 21 may have openings at four corners of the frame 21 and may be divided into four segments by the openings. The connection line 22 may include two crossed wires. In another example, as shown in FIG. 7(III), the frame 21 may have two openings located at two points at one side of the frame, and may be divided into two segments by the opening. The connection line 22 may be a curve line to connect the two segments. In another example, as shown in FIG. 7(IV), the frame 21 may have openings at four corners of the frame 21 and may be divided into four segments by the openings. The connection line 22 may include three straight wires. The three wires may form an H shape, with two wires on two sides respectively connected to two segments, and a third wire connected to the two wires on the two sides. In some embodiments, the connection line 22 may include more than three wires, detail implementations of the connection line 22 will not be exhaustively listed herein.

Each segment of the frame in the present invention may be connected to one of the connecting ends of the connection line, and each interior area may be connected with one of the openings, the integrity of the wire layer and the dielectric layer may be ensured.

In some embodiments of the present invention, as shown in FIG. 5, the frame 21 may have a rectangular shape, and may have four openings respectively located at four corners of the frame 21. The connection line 22 may include two straight wires, which may be perpendicularly crossed over each other. Two ends of each of the two wires may be respectively connected to midpoints of opposing sides of the frame 21. That is, the two wires may form a cross structure, so that the whole wire layer may form a symmetrical structure. Such a structure may provide sufficient current to the bond pad, and can provide reliable interlayer bonding force and mechanical strength to resist an upward tensile force when a bond wire is pulled in packaging.

Figure 8:
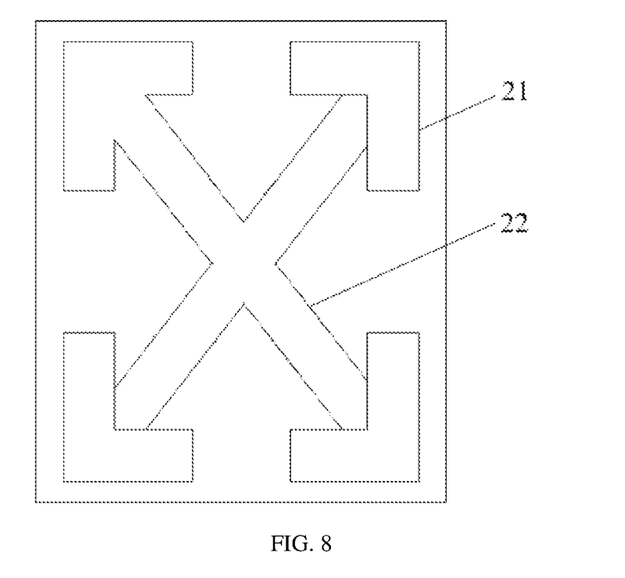
FIG. 8 is another schematic diagram of a wire layer of the present invention.

In some embodiments of the present invention, as shown in FIG. 8, the frame 21 may have a rectangular shape, and may have four openings and respectively located at centers of four sides of the frame 21. The connection line 22 may include two straight wires, which are crossed over each other. Two ends of each of the two wires may be respectively connected to opposite corners of the frame 21. That is, the two wires may form an X-shaped structure, so that the whole wire layer may form a symmetrical structure. Similar to the crossed structure, the X-shaped structure may provide sufficient current to the bond pad, and can provide reliable interlayer bonding force and mechanical strength to resist an upward tensile force when a bond wire is pulled in packaging.

Figure 9:
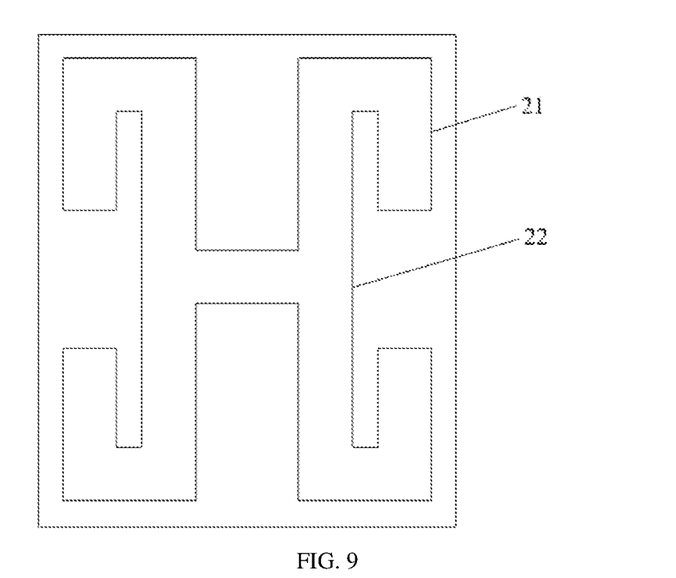
FIG. 9 is yet another schematic diagram of a wire layer of the present invention.

In some embodiments of the present invention, as shown in FIG. 9, the frame 21 may have a rectangular shape, and may have four openings respectively located at centers of four sides of the frame 21. The connection line 22 may include three straight wires, two of the three wires may respectively be connected to two segments located on a same side, and a third wire may be connected to midpoints of the two wires. That is, the three wires may form an H-shaped structure, so that the whole wire layer may form a symmetrical structure. Similar to the crossed structure, the H-shaped structure may provide sufficient current for the bond pad, and can provide reliable interlayer bonding force and mechanical strength to resist an upward tensile force when a bond wire is pulled in packaging.

In some embodiments of the present invention, the distribution layer structure may further include a through via 3, as shown in FIG. 5. The through via 3 may be embedded in the dielectric layer 1, electrically connected to the wire layer, and configured to connect the wire layer to a bond pad metal layer. The bond pad metal layer may often be located on the distribution layer structure. The through via 3 may serve for connection and conduction purposes, and may be configured to form electrical connection between the wire layer and the bond pad metal layer. The through via 3 may be disposed on any side of the wire layer. The through via 3 may be made of a material same as or different from that of the wire layer. Specification of the through via 3, such as the number, space, aperture, and depth of the through via 3, may be set according to actual requirements, and the present invention is not limited in this regard. Certainly, the wire layer may also be connected to the bond pad metal layer in other manners.

In some embodiments of the present invention, the distribution layer structure may further include a plurality of conductive layer, which may be configured to provide more conductive structures to facilitate further arrangement or optimization of the wires. One or more conductive layers may be provided. The one or more conductive layers may be successively disposed on a side of the wire layer facing away from the bond pad metal layer. The plurality of conductive layers may be electrically connected with each other, and may also be electrically connected to the wire layer. The electrical connection may be a direct-contact connection, or a connection via the through via. The conductive layers may have a structure the same as or different from the structure of the wire layer, and each of the plurality of conductive layers may have a structure the same as or different from each other, the present invention is not limited in this regard.

Figure 10:
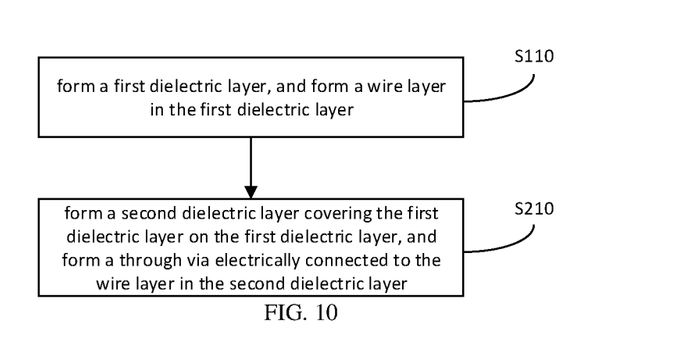
FIG. 10 is a flowchart illustrating a manufacturing method of a distribution layer structure of the present invention.
Figure 11:
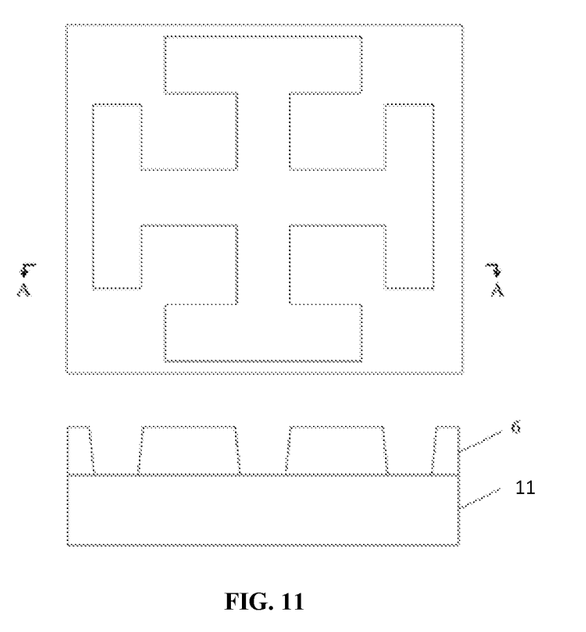
FIGS. 11, 12, and 13 are schematic diagrams of a manufacturing process of a wire layer of the present invention.

The present invention further provides a manufacturing method of the above distribution layer structure. As shown in FIG. 10, the manufacturing method may include the following steps S110 to S210.

In step 110, a first dielectric layer 11 may be formed, and a wire layer may be formed in the first dielectric layer.

Further, in step 110, the wire layer may be formed in the first dielectric layer through the following steps.

In step 111, according to a structure of the wire layer, a photoresist 6 may be deposited on the first dielectric layer 11. The photoresist may be a positive photoresist or a negative photoresist. In an example in which a positive photoresist is used, the positive photoresist may be subjected to exposure, development, lithography and etching, so that an opening may be formed on the photoresist. The shape of the opening on the photoresist may be the consistent with the desired shape of the wire layer, as shown, for example, in FIG. 11.

Figure 12:
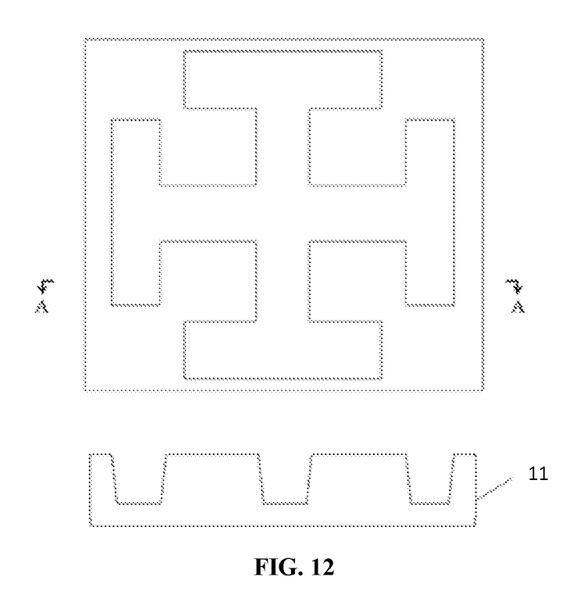

In step 112, an open portion not covered and protected by the photoresist may be removed with an etchant to form a groove, so that a pattern on the photoresist may be transferred to the layer of material underneath the photoresist, as shown in FIG. 12.

Figure 13:
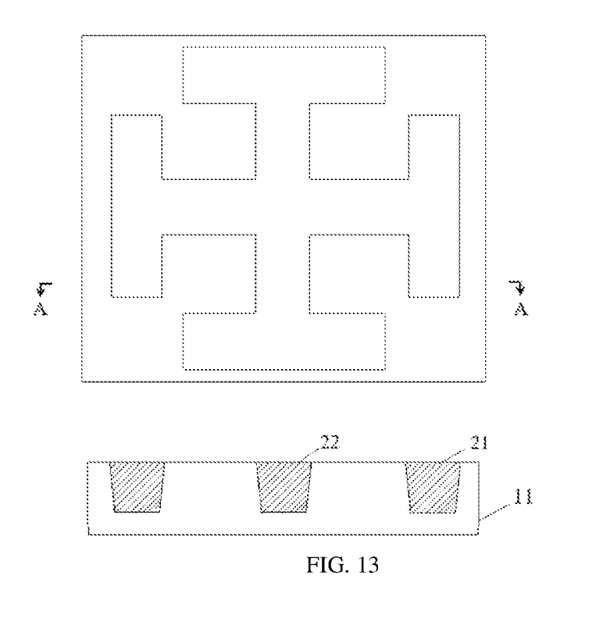

In step 113, a conductive material may be deposited in the groove with, for example, a physical vapor deposition method or an electro-plating method. Then a surface of the conductive material may be grinded via a chemical-mechanical polishing process to form the wire layer, as shown in FIG. 13.

In some embodiments, the distribution layer structure may further include a through via, and the manufacturing method may further includes the following steps.

In step 210, a second dielectric layer 12 may be formed on the first dielectric layer 11 to cover the first dielectric layer 11, and a through via electrically connected to the wire layer may be formed in the second dielectric layer 12.

The procedure to form the through via electrically connected to the wire layer in the second dielectric layer may be similar to that of forming the wire layer. The procedure may include the following steps.

In step 211, according to the structure of the through via, a photoresist may be deposited on the first dielectric layer already formed with the wire layer. In an example in which a positive photoresist is used, the positive photoresist may be subjected to exposure, development, lithography and etching, so that an opening may be formed on the photoresist. The shape of the opening on the photoresist may be consistent with the desired shape of the through via.

In step 212, an open portion not covered and protected by the photoresist may be removed with an etchant to form a through hole.

Figure 14:
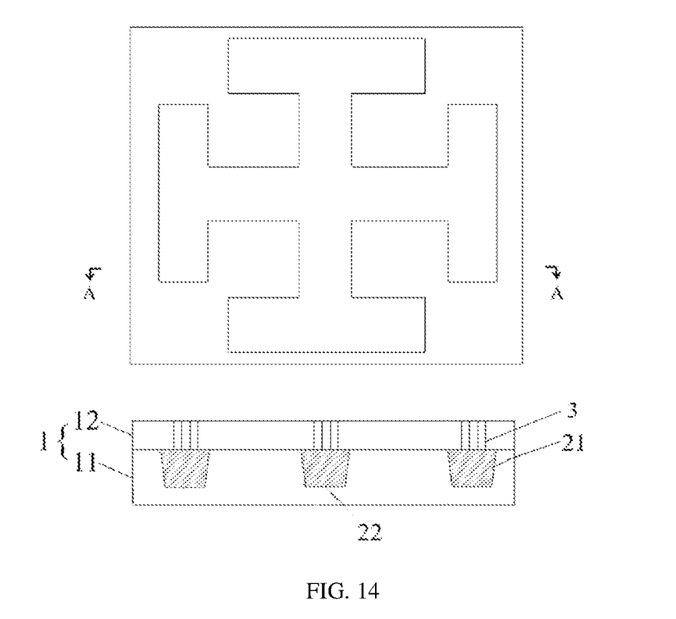
FIG. 14 is a schematic diagram of a through via of the present invention.

In step 213, a conductive material may be deposited in the through hole with, for example, a physical vapor deposition method or an electro-plating method. Then a surface of the conductive material may be grinded via a chemical-mechanical polishing process to form the through via, with a bottom of the through via electrically connected to the wire layer, as shown in FIG. 14.

The above embodiment only serves as an example, and the description on the steps therein is merely an embodiment rather than a limit to the steps of the manufacturing method of the present invention. It may also be appropriate for the present invention to first form the through via in one dielectric layer, and then form the wire layer in the dielectric layer on the other side.

Figure 15:
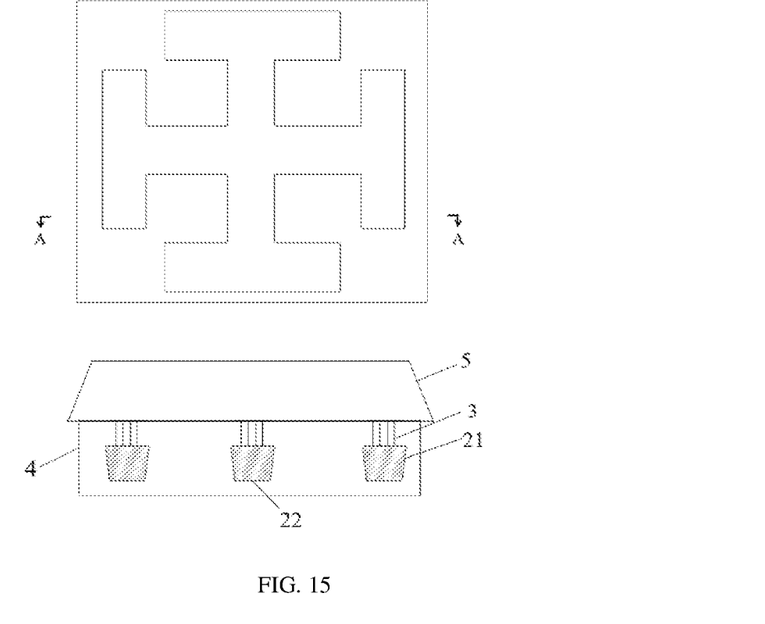
FIG. 15 is a schematic diagram of a bond pad metal layer of the present invention.

The present invention further provides a bond pad structure. As shown in FIG. 15, the bond pad structure may include the distribution layer structure 4 described in any of the aforementioned embodiments, and may further include a bond pad metal layer 5. The bond pad metal layer 5 may be disposed on the distribution layer structure 4, and may be electrically connected to the distribution layer structure 4. Since the distribution layer structure of this invention has a stronger structure than existing structures, the bond pad provided by the present invention also has superior mechanical strength, and can resist the pulling force when a bond wire is pulled in wire bonding of packaging.

The bond pad provided by the present invention may also be configured to mount various electronic components. The bond pad may have a circular shape, a square shape, or an octagonal shape, and the packaging may be done by, for example, wire bonding, pin or surface mounting. Correspondingly, each electronic component may have a rectangular shape, a circular shape, or a rhombic shape, etc. The bond pad provided by the present invention may also be used in a plurality of circuit boards, specific applications of the bond pad will not be exhaustively listed herein. The bond pad metal layer may be configured to bond an exterior wire. For the ease of electrical connection, the bond pad metal layer may be made of a block of conductive material, including one or more of copper, aluminum and tungsten, or other conductive materials.

In some embodiments of the present invention, the bond pad metal layer 5 may be formed by depositing a metallic material on the distribution layer structure, as shown in FIG. 15. The wire layer 2 in the distribution layer structure 4 of the bond pad may be electrically connected to the bond pad metal layer 5 via a through via 3.

Figure 16:
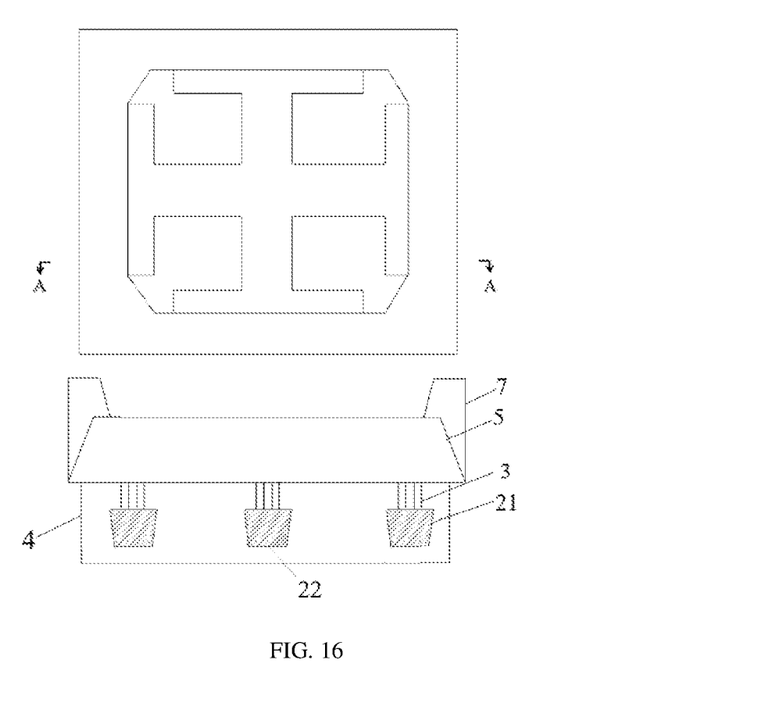
FIG. 16 is a schematic diagram of a protective layer of the present invention.

In some embodiments of the present invention, the bond pad structure may further include a protective layer 7 located on and around the bond pad metal layer 5, as shown in FIG. 16. The protective layer 7 may be made of an insulation material such as polyimide. An opening may be provided in a center of the protective layer 7 to expose the bond pad metal layer 5 and to facilitate the electrical connection with exterior structures.

Although relative terms are used in the specification, for example, "on" and "under" are used to describe a relative relationship of one numeral component to another component, these terms used in the specification are merely for the convenience, for instance, according to an exemplary direction in the drawings. It is to be understood that if a numeral apparatus is reversed to turn upside down, a component described to be "on" will become a component to be "under". When a structure is "on" other structure, it may be indicated that the structure is integrally formed on the other structure, or indicated that the structure is "directly" disposed on the other structure, or indicated that the structure is "indirectly" disposed on the other structure via another structure.

Terms "a", "an", "one", "the", "said" and "at least one" are used to represent one or more elements/compositional portions. Terms "include", "including", "comprise", "comprising", "has" and "having" are used to represent a meaning of open inclusion and refer to that another elements/compositional portions may further be present besides the listed elements/compositional portions.

Other embodiments of the present invention will be apparent to the person skilled in the art from consideration of the specification and practice of the present invention disclosed here. The present invention is intended to cover any variations, uses, or adaptations of the present invention following the general principles thereof and including such departures from the present invention as come within known or customary practice in the art. It is intended that the specification and embodiment are considered as being exemplary only, with a true scope and spirit of the present invention indicated by the appended claims.

The invention claimed is:

1. A distribution layer structure, comprising:
a dielectric layer; and
a wire layer embedded in the dielectric layer, and comprising a frame and a connection line, wherein the frame has four openings and is divided into a plurality of segments by the four openings, the connection line is located inside the frame and connected to each of the segments, the connection line divides an interior of the frame into a plurality of areas, and each of the areas is connected to one of the openings,
wherein the openings are distributed on the frame symmetrically or asymmetrically, and
wherein the frame has a rectangular shape, and the connection line comprises two wires, wherein the four openings are respectively located at four corners of the frame, the two wires are crossed over each other perpendicularly, and each of the two wires has two ends respectively connected to midpoints of sides of the frame.

2. The structure of claim 1, wherein each of the two wires has a linear shape.

3. The structure of claim 2, wherein the wires are disposed symmetrically or asymmetrically.

4. The structure of claim 1, wherein the wire layer is located on one side of a bond pad metal layer, and
wherein the structure further comprises:

a through via embedded in the dielectric layer and electrically connected to the wire layer, and configured to connect the wire layer and the bond pad metal layer.

5. The structure of claim 4, further comprising:
a plurality of conductive layers, located on a side of the wire layer facing away from the bond pad metal layer, wherein the plurality of conductive layers are electrically connected with each other, and electrically connected to the wire layer.

6. The structure of claim 1, wherein the wire layer is made of one or more of copper, aluminum and tungsten.

7. The structure of claim 4, further comprising:
a protective layer covering the bond pad metal layer, and having an opening exposing the bond pad metal layer.

8. A distribution layer structure, comprising:
a dielectric layer; and
a wire layer embedded in the dielectric layer, and comprising a frame and a connection line, wherein the frame has four openings and is divided into a plurality of segments by the four openings, the connection line is located inside the frame and connected to each of the segments, the connection line divides an interior of the frame into a plurality of areas, and each of the areas is connected to one of the openings,
wherein the openings are distributed on the frame symmetrically or asymmetrically, and
wherein the frame has a rectangular shape, and the connection line comprises two wires, and wherein the four openings are respectively located at centers of four sides of the frame, the two wires are crossed over each other, and each of the two wires has two ends respectively connected to opposite corners of the frame.

9. The structure of claim 8, wherein each of the two wires has a linear shape.

10. The structure of claim 9, wherein the wires are disposed symmetrically or asymmetrically.

11. The structure of claim 8, wherein the wire layer is located on one side of a bond pad metal layer, and
wherein the structure further comprises:
a through via embedded in the dielectric layer and electrically connected to the wire layer, and configured to connect the wire layer and the bond pad metal layer.

12. The structure of claim 11, further comprising:
a plurality of conductive layers, located on a side of the wire layer facing away from the bond pad metal layer, wherein the plurality of conductive layers are electrically connected with each other, and electrically connected to the wire layer.

13. The structure of claim 8, wherein the wire layer is made of one or more of copper, aluminum and tungsten.

14. The structure of claim 11, further comprising:
a protective layer covering the bond pad metal layer, and having an opening exposing the bond pad metal layer.

15. A distribution layer structure, comprising:
a dielectric layer; and
a wire layer embedded in the dielectric layer, and comprising a frame and a connection line, wherein the frame has four openings and is divided into a plurality of segments by the four openings, the connection line is located inside the frame and connected to each of the segments, the connection line divides an interior of the frame into a plurality of areas, and each of the areas is connected to one of the openings,
wherein the openings are distributed on the frame symmetrically or asymmetrically, and
wherein the frame has a rectangular shape, and the connection line comprises three wires, and wherein the four openings are respectively located at centers of four sides of the frame, two wires of the three wires are each connected to segments corresponding to two sides of the frame on a same side, and a third wire of the three wires is connected to midpoints of the two wires.

16. The structure of claim 15, wherein the wire layer is located on one side of a bond pad metal layer, and
wherein the structure further comprises:
a through via embedded in the dielectric layer and electrically connected to the wire layer, and configured to connect the wire layer and the bond pad metal layer.

17. The structure of claim 16, further comprising:
a plurality of conductive layers, located on a side of the wire layer facing away from the bond pad metal layer, wherein the plurality of conductive layers are electrically connected with each other, and electrically connected to the wire layer.

18. The structure of claim 15, wherein the wire layer is made of one or more of copper, aluminum and tungsten.

19. The structure of claim 16, further comprising:
a protective layer covering the bond pad metal layer, and having an opening exposing the bond pad metal layer.

\* \* \* \* \*